(12) United States Patent
Inoue et al.

(10) Patent No.: US 7,233,219 B2
(45) Date of Patent: Jun. 19, 2007

(54) BALANCED OUTPUT FILTER HAVING SPECIFIED PACKAGE INPUT AND OUTPUT GROUND METAL PATTERNS

(75) Inventors: Shogo Inoue, Kawasaki (JP); Motoyuki Tajima, Yokohama (JP); Takayuki Yamaji, Yokohama (JP); Yasufumi Kaneda, Yokohama (JP); Osamu Kawachi, Yokohama (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 104 days.

(21) Appl. No.: 11/114,128

(22) Filed: Apr. 26, 2005

(65) Prior Publication Data

US 2005/0242903 A1    Nov. 3, 2005

(30) Foreign Application Priority Data

Apr. 28, 2004   (JP)   ............................ 2004-134388

(51) Int. Cl.
*H03H 9/64* (2006.01)
(52) U.S. Cl. ...................................... 333/193; 333/195
(58) Field of Classification Search ................ 333/193, 333/195
See application file for complete search history.

(56) References Cited

U.S. PATENT DOCUMENTS

| | | | | |
|---|---|---|---|---|
| 5,994,980 A * | 11/1999 | Tada ............................ 333/193 |
| 6,107,899 A * | 8/2000 | Taguchi et al. ............. 333/193 |
| 6,353,372 B1 | 3/2002 | Baier et al. |
| 6,388,545 B1 * | 5/2002 | Kawachi et al. ............ 333/193 |
| 6,720,842 B2 * | 4/2004 | Sawada ....................... 333/133 |
| 6,756,867 B2 * | 6/2004 | Takamine .................... 333/193 |
| 6,882,249 B2 * | 4/2005 | Takamine et al. ........... 333/193 |
| 6,940,369 B2 * | 9/2005 | Nakahashi et al. ......... 333/195 |
| 7,098,758 B2 * | 8/2006 | Wang et al. ................. 333/189 |
| 2002/0057141 A1 * | 5/2002 | Nishizawa et al. ......... 333/193 |
| 2004/0196119 A1 * | 10/2004 | Shibahara et al. ......... 333/193 |

FOREIGN PATENT DOCUMENTS

| | | |
|---|---|---|
| EP | 0 798 852 A1 | 10/1997 |
| EP | 1 126 605 A2 | 8/2001 |
| JP | 9-116377 | 5/1997 |
| JP | 10-93381 A | 4/1998 |
| JP | 10-126213 A | 5/1998 |
| JP | 10-224175 * | 8/1998 |
| JP | 11-122070 A | 4/1999 |
| JP | 11-145772 A | 5/1999 |
| JP | 2000-049565 A | 2/2000 |
| JP | 2000-91871 * | 3/2000 |
| JP | 2001-308672 A | 11/2001 |
| JP | 2002-111440 A | 4/2002 |
| JP | 2003-204245 A | 7/2003 |
| JP | 2003-273707 | 9/2003 |
| JP | 2004-7575 A | 1/2004 |
| JP | 2004-88551 A | 3/2004 |

* cited by examiner

*Primary Examiner*—Barbara Summons
(74) *Attorney, Agent, or Firm*—Arent Fox LLP

(57) ABSTRACT

A balanced filter includes a package having an input ground metal pattern and an output ground metal pattern, and a filter chip having an inphase filter and an antiphase filter, which filters are mounted on the package, at least one of the inphase and antiphase filters having an input ground terminal connected to the input ground metal pattern and an output ground terminal connected to the output ground metal pattern, the input and output ground terminals of said at least one of the inphase and antiphase filters being separate from each other on the filter chip.

13 Claims, 16 Drawing Sheets

PRIOR ART

FIG. 15A
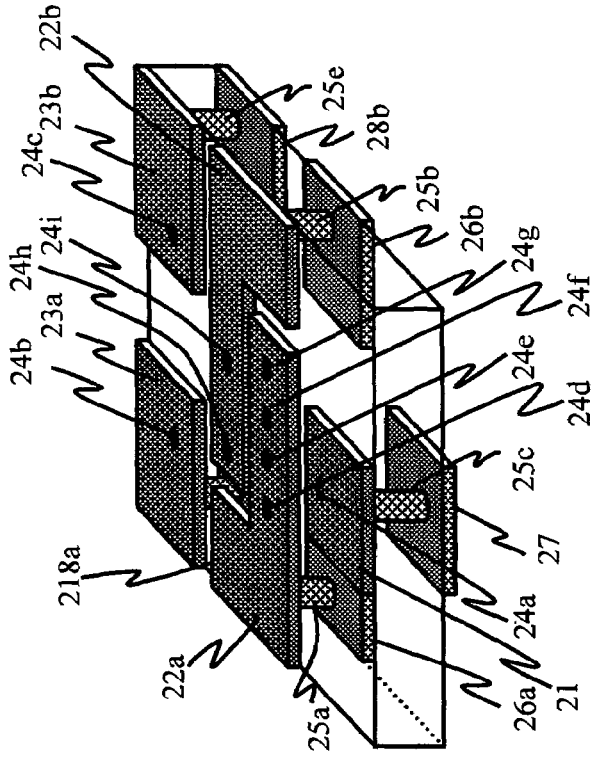
FIG. 15B
FIG. 15C
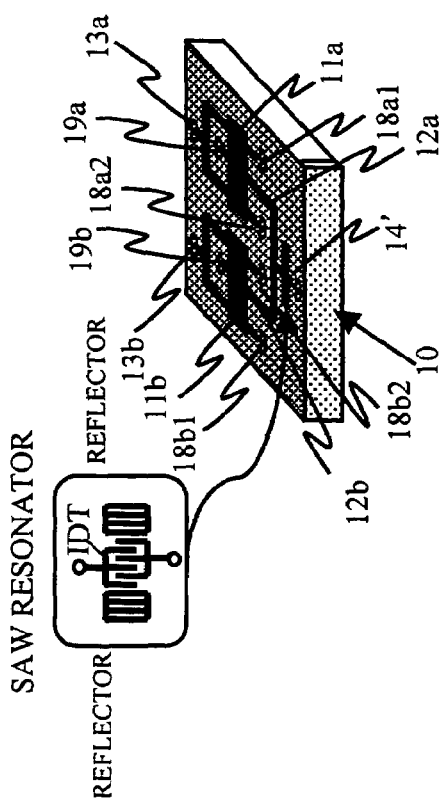
FIG. 15D
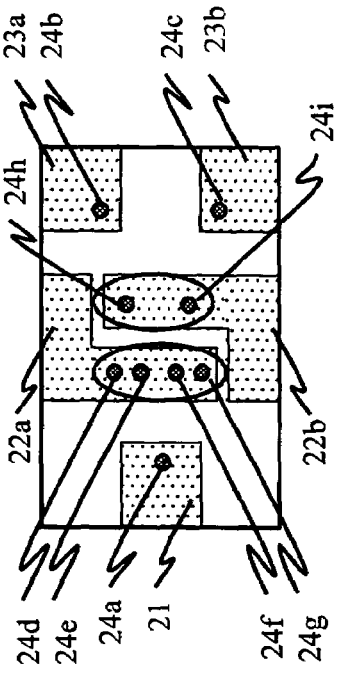

BALANCED OUTPUT FILTER HAVING SPECIFIED PACKAGE INPUT AND OUTPUT GROUND METAL PATTERNS

BACKGROUND OF THE INVENTION

1. Field of the Invention

This invention generally relates to balanced output filters, and more particularly, to a balanced output filter excellent in both amplitude balance characteristics and phase balance characteristics.

2. Description of the Related Art

An interstage filter used for a receive circuit of a mobile telephone terminal often employs a balanced output filter that can reduce noises and can be connected to an external IC directly. For example, the balanced output filter utilizing a surface acoustic wave (hereinafter referred to as SAW) is capable of realizing low insertion loss and high suppression at the same time. Therefore, in most cases, the aforementioned balanced filters are incorporated into the mobile telephone terminals distributed in the market. The structure of the balanced filter is classified into several categories, one of which is a "parallel balanced filter".

FIG. 1 is a schematic view showing a representative structure of the parallel balanced filter. An input terminal 102a of a filter 101a is connected to another input terminal 102b of another filter 101b. The input terminals 102a and 102b are connected to an unbalanced external input terminal 104. An output terminal 103a of the filter 101a and an output terminal 103b of the filter 101b are balanced output terminals. One of the filters is an inphase filter (101a), and is designed so that phases of an input signal and an output signal are substantially equal (inphase) ground the center frequency. The other filter is an antiphase filter (101b), and is designed so that the phases of the input signal and the output signal are substantially opposite (antiphase) by 180 degrees ground the center frequency. Balanced outputs are the outputs available at the output terminal 103a (a first balanced output terminal) of the inphase filter 101a and at the output terminal 103b (a second balanced output terminal) of the antiphase filter 101b. Another structure of the parallel balanced filter may include multiple inphase filters and antiphase filters and the input terminals and output terminals thereof are connected each other.

The low insertion loss in a passband and the high suppression in a stopband are especially important functions of the characteristics of the balanced filter. In addition, amplitude balance and phase balance are also important. The characteristics of the amplitude balance and those of the phase balance are simply referred to as balance characteristics. The amplitude balance is defined by a difference between one signal amplitude output from the output terminal (the first balanced output terminal) of the inphase filter and the other signal amplitude output from the output terminal (the second balanced output terminal) of the antiphase filter. The amplitude balance is considered more excellent as the difference is closer to zero. dB is usually used for a unit of the amplitude balance. On the other hand, the phase balance is defined by a difference between one signal phase output from the first balanced output terminal and the other signal phase output from the second balanced output terminal. The phase balance is considered more excellent as the difference is closer to 180 degrees. The above-mentioned balance characteristics have a dependency on the frequency. The balance characteristics are evaluated by how the amplitude balance is close to 0 dB, and how the phase balance is close to 180 degrees, in the passband of the balanced output filter.

FIG. 2 shows an example of a structure of a parallel balanced filter having a SAW filter thereon. An inphase filter and an antiphase filter included in the parallel balanced filter are double-mode SAW (hereinafter referred to as DMS) filters. It is easy to selectively use inphase or antiphase in the DMS filter, and the DMS filter is often used for the balanced filter. Here, the inphase filter is also referred to as inphase DMS, and the antiphase filter is also referred to as antiphase DMS.

An inphase DMS 201a and an antiphase DMS 201b are provided on a piezoelectric substrate 200. The inphase DMS 201a includes an input IDT (interdigital transducer) 205a, output IDTs 206a1 and 206a2 respectively arranged on both sides of the input IDT 205a. A pair of reflectors 207a1 and 207a2 are arranged outer sides of the output IDTs 206a1 and 206a2 respectively. An input ground terminal 209a is connected to ground electrode fingers of the input IDT 205a. Output ground terminals 208a1 and 208a2 are connected to ground electrode fingers of the output IDTs 206a1 and 206a2. In the same manner, the antiphase DMS 201b includes an input IDT (interdigital transducer) 205b, output IDTs 206b1 and 206b2 respectively arranged on both sides of the input IDT 205b. A pair of reflectors 207b1 and 207b2 is arranged outer sides of the output IDTs 206b1 and 206b2 respectively. An input ground terminal 209b is connected to ground electrode fingers of the input IDT 205b. Output ground terminals 208b1 and 208b2 are connected to ground electrode fingers of the output IDTs 206b1 and 206b2. Signals input from an unbalanced external input terminal 204 are input into the inphase DMS 201a and the antiphase DMS 201b through the respectively provided input terminals 202a and 202b, and are output from balanced output terminals 203a and 203b.

It is possible to selectively connect the inphase DMS or the antiphase DMS in the above-mentioned parallel balanced filter, by reversing the polarities of the electrode fingers of the input IDT or the output IDT, changing the number of the electrode fingers of the input IDT, or changing gaps between the input IDT and the output IDT. The above-mentioned SAW filter chip is housed in a ceramic package or a plastic package. The SAW filter chip is electrically coupled to the package by bonding wires, Au bumps, or solder balls. A facedown structure is mainly employed in these years, because the facedown structure makes it possible to downsize and reduce the thickness of a whole SAW device.

FIGS. 3A and 3B are views of a conventional balanced output SAW filter having the SAW filter chip facedown bonded to a package 210. The SAW chip is formed on the piezoelectric substrate 200. FIG. 3A illustrates each component in detail to mount the SAW filter chip on the package. FIG. 3B is a top view of a die attach surface of the package. This package is composed of a laminated body of a first layer arranged as a bottom layer and a second layer arranged as a top layer. The die attach surface forms an upper surface of the first layer. The SAW filter chip is made up of the inphase DMS 201a and the antiphase DMS 201b. The inphase DMS 201a and the antiphase DMS 201b are connected in parallel on the piezoelectric substrate 200. The inphase DMS 201a includes the input terminal 202a, the input ground terminal 209a, the output ground terminals 208a1 and 208a2, and the balanced output terminal 203a. The antiphase DMS 201b includes the input terminal 202b, the input ground terminal 209b, the output ground terminals 208b1 and 208b2, and the balanced output terminal 203b. The input terminals 202a and 202b are connected to the external input terminal 204 provided on the piezoelectric substrate 200.

Referring to FIG. 3B, the die attach surface of the package 210 (a mounting surface of the SAW filter chip) has an input terminal 211, a ground terminal 212, a first balanced output terminal 213a, and a second balanced output terminal 213b. Au bumps (or solder balls) 214a through 214i are provided on the filter chip so as to bond and connect the aforementioned terminals and the package 210. The Au bump 214a provided on the input terminal 211 is coupled to the input terminal 204 of the SAW filter chip. The Au bump 214b provided on the first balanced output terminal 213a is coupled to the balanced output terminal 203a of the inphase DMS 201a of the SAW filter chip. The Au bump 214c provided on the second balanced output terminal 213b is coupled to the balanced output terminal 203b of the antiphase DMS 201b of the SAW filter chip. The Au bumps 214d through 214i provided on the ground terminal 212 are divided into two groups. Four Au bumps 214d through 214g are coupled to the output ground terminals 208a1, 208a2, 208b1, and 208b2 of the SAW filter chip. Two Au bumps 214h and 214i are connected to the input ground terminals 209a and 209b.

That is to say, the input ground terminals 209a and 209b and the output ground terminals 208a1, 208a2, 208b1, and 208b2 are connected on a metal pattern on the die attach surface of the package 210, and then are connected to a first ground footpad 216a and a second ground footpad 216b through a first via 215a and a second via 215b. The first ground footpad 216a and the second ground footpad 216b are provided on a backside of the package 210. The input terminal 211, the first balanced output terminal 213a, and the second balanced output terminal 213b provided on the die attach surface are respectively connected to the corresponding footpads through a third via 215c, a fourth via 215d, and a fifth via 215e. The corresponding footpads are an input footpad 217, a first balanced output footpad 218a, and a second balanced output footpad 218b.

FIGS. 4A and 4B are graphs showing examples of the balance characteristics of the balanced output SAW filter having the above-mentioned structure. FIG. 4A shows amplitude balance characteristics. FIG. 4B shows phase balance characteristics. In both FIGS. 4A and 4B, the vertical axis denotes frequency (MHz). The horizontal axis in FIG. 4A denotes the amplitude balance by the dB. The horizontal axis in FIG. 4B denotes the phase balance by the degree. These figures tell that the amplitude balance is ±0.9 dB or less, and the phase balance is 180±5 degrees, when the balance characteristics are evaluated.

Japanese Patent Application Publication No. 2003-273707 discloses an elastic wave device having balancing capabilities. This elastic wave device is not connected to an external impedance chip to the outside, and is excellent in the amplitude balance in the passband in particular. Japanese Patent Application Publication No. 9-116377 discloses an elastic wave device having a packaged structure that is capable of obtaining high attenuation characteristics. However, more excellent balance characteristics are demanded for the balanced output filter used on a today's mobile telephone terminal in order to increase the flexibility of the circuit design in the mobile telephone terminal. The amplitude balance is demanded to be closer to 0 dB, and the phase balance is demanded to be closer to 180 degrees.

SUMMARY OF THE INVENTION

The present invention has been made in view of the above circumstances and provides a technique for significantly improving both characteristics of the amplitude balance and the phase balance of a balanced output filter.

According to an aspect of the present invention, preferably, there is provided a balanced filter including a package having an input ground metal pattern and an output ground metal pattern; and a filter chip having an inphase filter and an antiphase filter, which filters are mounted on the package, at least one of the inphase and antiphase filters having an input ground terminal connected to the input ground metal pattern and an output ground terminal connected to the output ground metal pattern, the input and output ground terminals of said at least one of the inphase and antiphase filters being separate from each other on the filter chip.

It is thus possible to reduce (or eliminate) a common ground inductance, and thereby provide the balanced filter in which both of the amplitude characteristics and the phase characteristics are largely improved.

BRIEF DESCRIPTION OF THE DRAWINGS

Preferred embodiments of the present invention will be described in detail with reference to the following drawings, wherein:

FIGS. 15A through 15D illustrate a configuration of a balanced output filter in accordance with a sixth embodiment of the present invention.

DESCRIPTION OF THE PREFERRED EMBODIMENTS

A description will now be given, with reference to the accompanying drawings, of embodiments of the present invention. The balanced output filter of the present invention includes a metal pattern formed in the package so that a "common ground inductance" Lg3 mounted on the package may be smaller than those of the conventional filters. The common ground inductance Lg3 corresponds to an inductance added between the common ground terminal and an external ground terminal. The common ground terminal corresponds to a connection point of the input ground terminal and the output ground terminal.

Specifically, the metal pattern is configured so that the common ground terminal is arranged closer to the external ground terminal as much as possible in order to reduce the common ground inductance Lg3. The common ground terminal is a connection point of the input ground terminal and the output ground terminal. Alternatively, the ground pattern is configured so that the input ground terminal and the output ground terminal are completely separate, without providing the common ground pattern. The package structure having the above-mentioned metal patterns reduces the common ground inductance Lg3 or sets the common ground inductance Lg3 to zero. The balance characteristics of the balanced output filter are thus improved significantly.

The idea of forming the metal pattern is based on the following studies. The inventors of the present invention have tried to identify a factor that affects the balance characteristics with a simulation for the purpose of improving the balance characteristics of the balanced output filter.

Figure 5A:
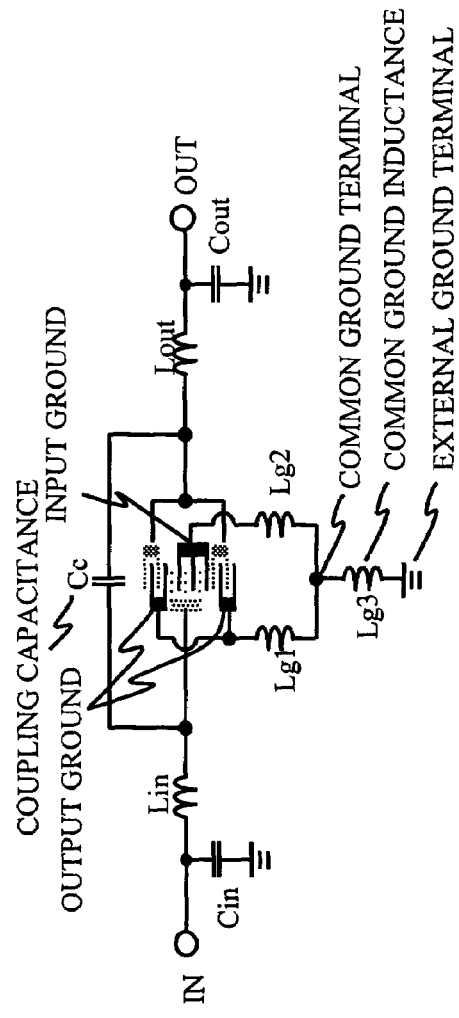
FIGS. 5A and 5B schematically illustrate a circuit model used for the simulation that provides the basis of the present invention.
Figure 5B:
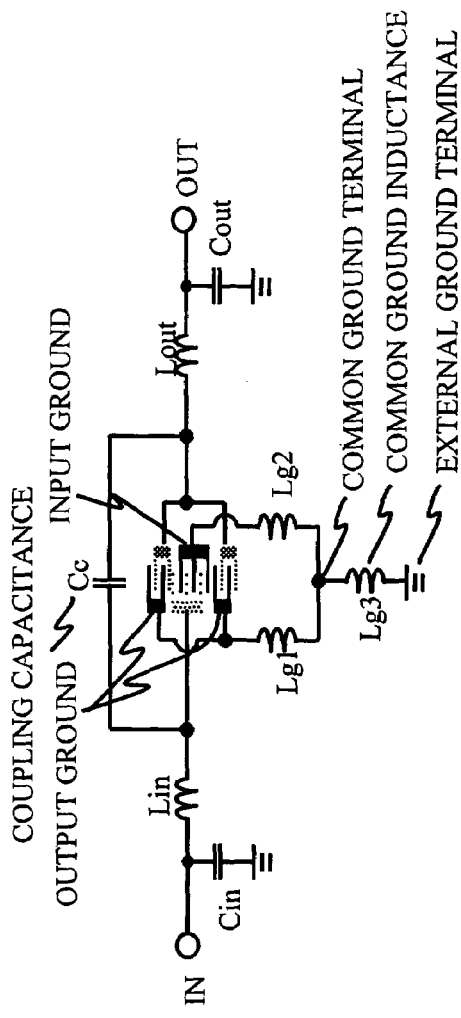

FIGS. 5A and 5B schematically illustrate a circuit model used for the simulation that provides the basis of the present invention. In this circuit model, the filter mounted on the package includes one inphase DMS and one antiphase DMS. The inphase DMS shown in FIG. 5A and the antiphase DMS shown in FIG. 5B are separate filters. Each circuit of the filters includes an input capacitance Cin, an input inductance Lin, an output capacitance Cout, an output inductance Lout, a coupling capacitance Cc between the input and output, an output ground inductance Lg1, an input ground inductance Lg2, and a common ground inductance Lg3. The simulation has been performed with thus arranged parameters.

In the simulation, first, the filter characteristics of the inphase DMS and the antiphase DMS are calculated respectively based on the well-known "mode coupling theory". Then, the differences of the insertion loss and the difference of the passband phase in the filters are considered to be the amplitude balance and the phase balance for simplification, and the balance characteristics are evaluated. The simulation result of the balance characteristics largely corresponds to those obtained by the experiment. The validity of the circuit model shown in FIGS. 5A and 5B has been thus confirmed.

Figure 4A:
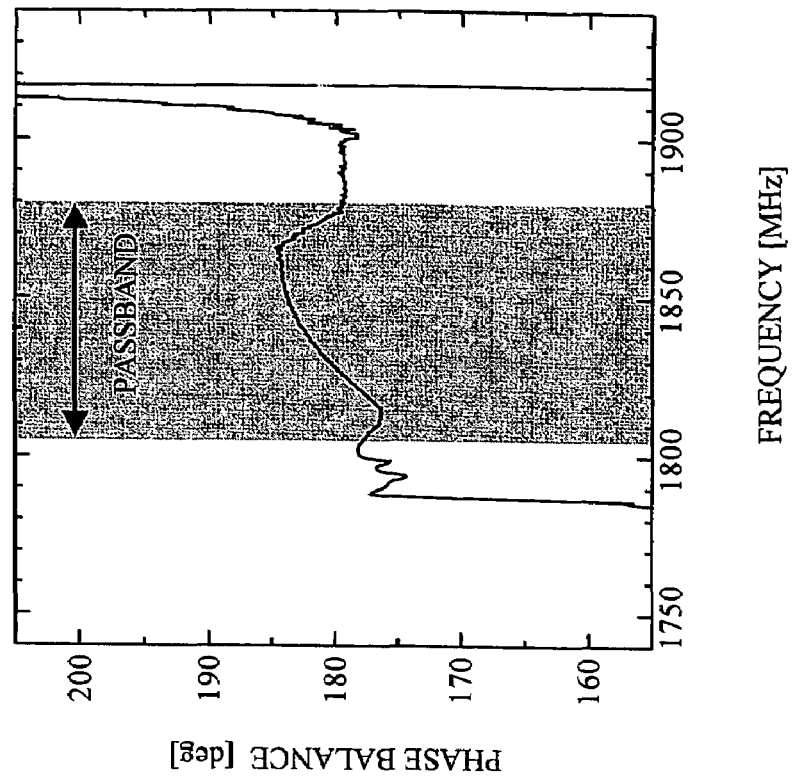
FIGS. 4A and 4B are graphs showing the balance characteristics of the balanced output SAW filter.
Figure 4B:
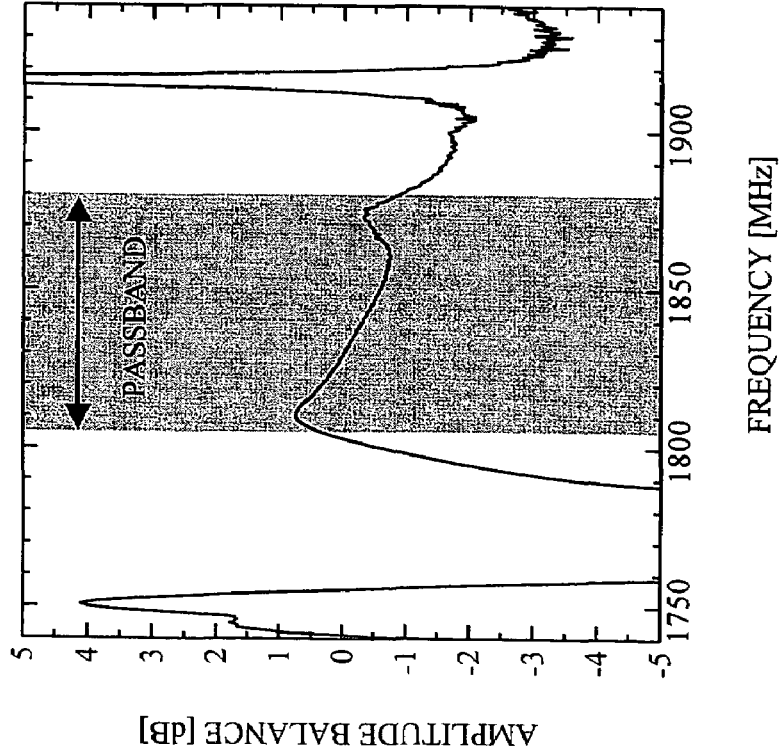
Figure 6A:
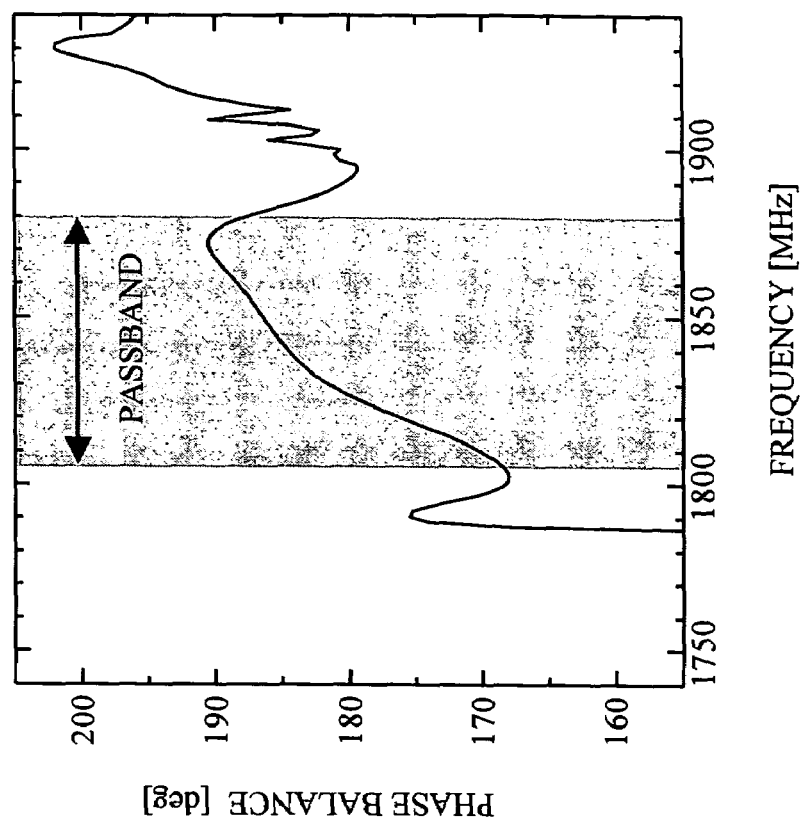
FIGS. 6A and 6B are the simulation results of the balance characteristics of the balanced SAW filter having a conventional structure, according to the circuit model shown in FIGS. 5A and 5B.
Figure 6B:
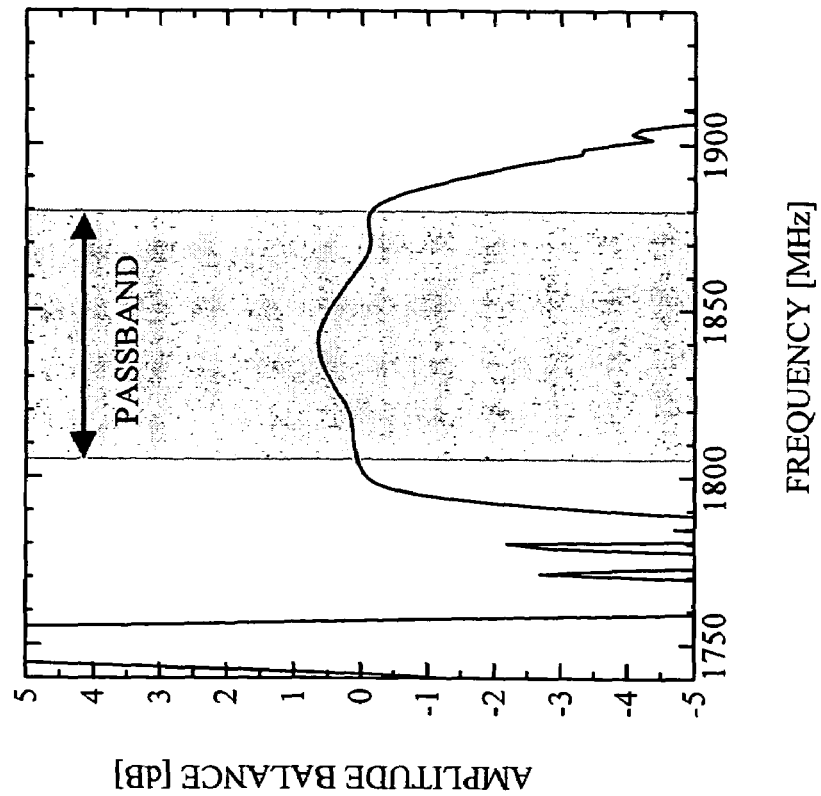

FIGS. 6A and 6B show the simulation results of the balance characteristics of the balanced SAW filter having a conventional structure, according to the circuit model shown in FIGS. 5A and 5B. FIG. 6A shows the amplitude balance characteristics. FIG. 6B shows the phase balance characteristics. In FIGS. 6A and 6B, the vertical axis denotes frequency (MHz). The horizontal axis in FIG. 6A denotes the amplitude balance by the dB. The horizontal axis in FIG. 6B denotes the phase balance by the degree. The balance characteristics shown in FIGS. 6A and 6B are different from those shown in FIGS. 4A and 4B, because the balance characteristics are simulated without connecting the input terminals of the inphase DMS and the antiphase DMS. The aforementioned difference does not become an obstacle in evaluating how each of the parameters affects the balance characteristics. The circuit model can be evaluated to be sufficient.

As a result of the studies of the parameters used in the circuit model shown in FIGS. 5A and 5B (the input capacitance Cin, the input inductance Lin, the output capacitance Cout, the output inductance Lout, the coupling capacitance Cc between the input and output, the output ground inductance Lg1, the input ground inductance Lg2, and the common ground inductance Lg3), the coupling capacitance Cc and the common ground inductance Lg3 degrade the balance characteristics. It has turned out that the other parameters do not affect the balance characteristics at all. More precisely, the balance characteristics are more excellent as both of the coupling capacitance Cc and the common ground inductance Lg3 are closer to zero.

With respect to the above-mentioned two findings of the coupling capacitance Cc and the common ground inductance Lg3, one of the findings has already been known that the balance characteristics are more excellent as the coupling capacitance Cc is closer to zero. Generally, the coupling capacitance Cc generated on the SAW filter chip or the package is designed to be as small as possible. However, the inventors of the present invention have obtained the other finding for the first time that the balance characteristics are more excellent as the common ground inductance Lg3 is closer to zero.

As described, the common ground inductance Lg3 corresponds to an inductance added between the common ground terminal and an external ground terminal. The common ground terminal corresponds to a connection point of the input ground terminal and the output ground terminal. Referring back to FIGS. 3A and 3B, the ground terminal 212 on the die attach surface corresponds to the common ground terminal. The first ground footpad 216a and the second ground footpad 216b correspond to the external ground terminal. The inductance component of the first via 215a and the second via 215b corresponds to the common ground inductance Lg3. The first via 215a and the second via 215b are respectively provided between the ground terminal 212 and the first and second ground footpad 216a and 216b.

Figure 7A:
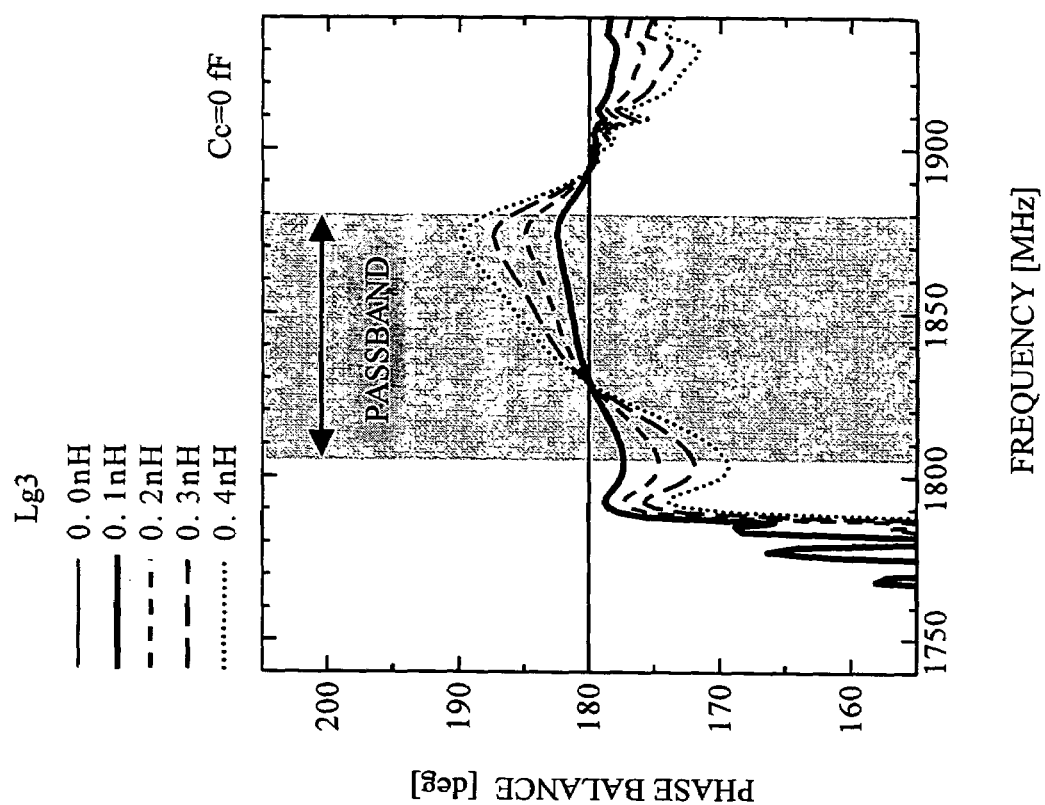
FIGS. 7A and 7B show simulation results of the balance characteristics obtained by changing a common ground inductance Lg3 as a parameter.
Figure 7B:
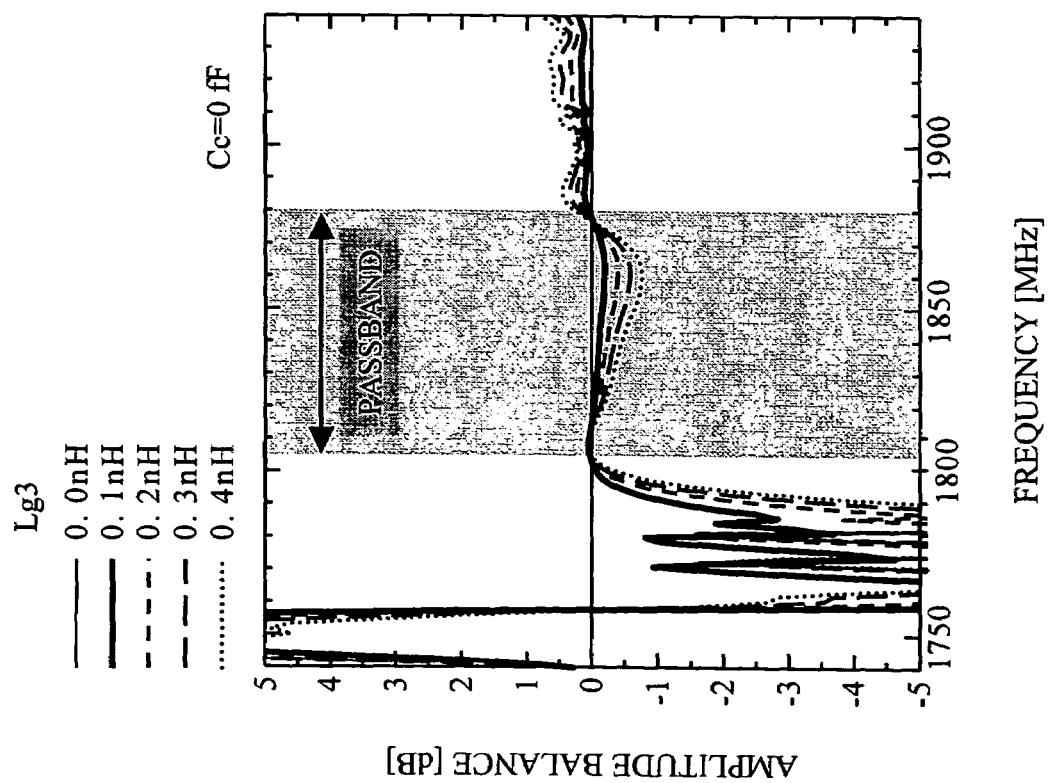

FIGS. 7A and 7B show simulation results of the balance characteristics obtained by changing the common ground inductance Lg3 as the parameter. The horizontal axis in FIG. 7A denotes the amplitude balance by the dB. The horizontal axis in FIG. 7B denotes the phase balance by the degree. Here, the simulation has been performed with the coupling capacitance Cc between the input and output set to zero (0 pf). The simulation results show that both of the amplitude balance and the phase balance are in an ideal state, when the common ground inductance Lg3 is zero (0 nH). As the common ground inductance Lg3 increases, both the amplitude balance and the phase balance deteriorate. This proves that the coupling capacitance Cc and the common ground inductance Lg3 have to be configured as small as possible, in order to improve the balance characteristics of the balanced output filter.

The present invention has been made on the basis of the finding that the balance characteristics are more excellent as the common ground inductance Lg3 of the balanced output filter is closer to zero, and has an object to realize the excellent balance characteristics. The filter chip mounted as the balanced output filter is not limited to that employing the double-mode SAW filter composed of one input IDT and two output IDTs. The present invention may be applied to other types of the balanced output filters employing various SAW filters, such as another type of the double-mode SAW filter composed of one input IDT and one output IDT, a SAW filter having multiple electrodes composed of multiple input IDTs and multiple output IDTs, and the like. Additionally, the present invention is not limited to the SAW filter but may be applied to other balanced output filters employing various filters such as FBAR (Film Bulk Acoustic Resonator) filter, BAW (Bulk Acoustic Wave) filter, dielectric filter, and the like. A description will be given of embodiments of the present invention in detail.

(First Embodiment)

Figure 8A:
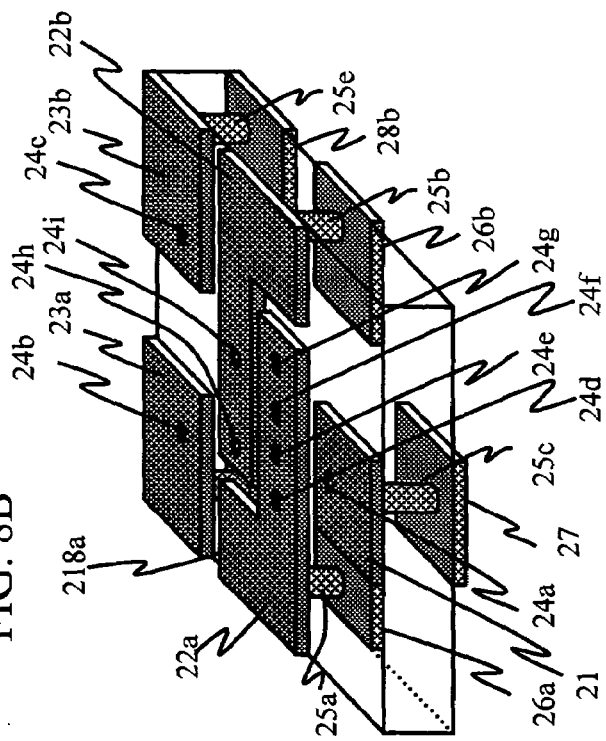
FIGS. 8A through 8D illustrate a configuration of a balanced output filter in accordance with a first embodiment of the present invention.
Figure 8B:
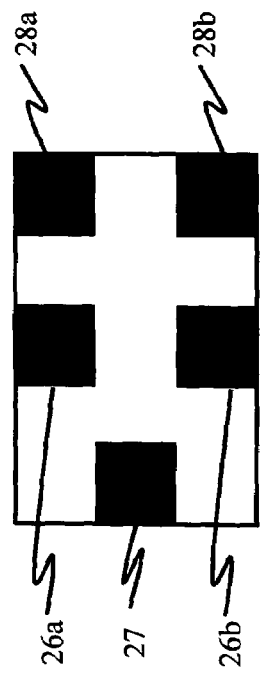
Figure 8C:
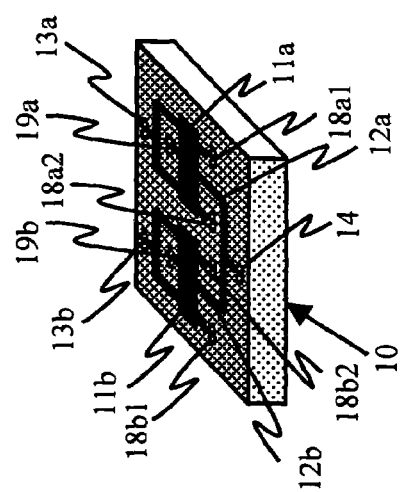
Figure 8D:
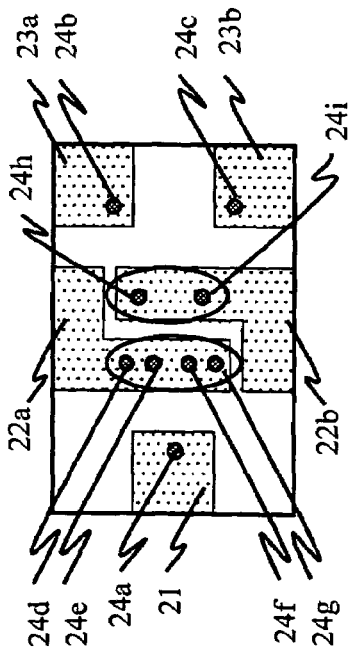

FIGS. 8A through 8D illustrate a configuration of a balanced output filter in accordance with a first embodiment of the present invention. FIG. 8A is a perspective view of the SAW filter chip. FIG. 8B shows a structure of a first layer of a package like the package shown in FIGS. 3A and 3B. FIG. 8C is a top view of the die attach surface of the package. FIG. 8D shows a layout of the footpads arranged on the backside of the package (the first layer).

Figure 1:
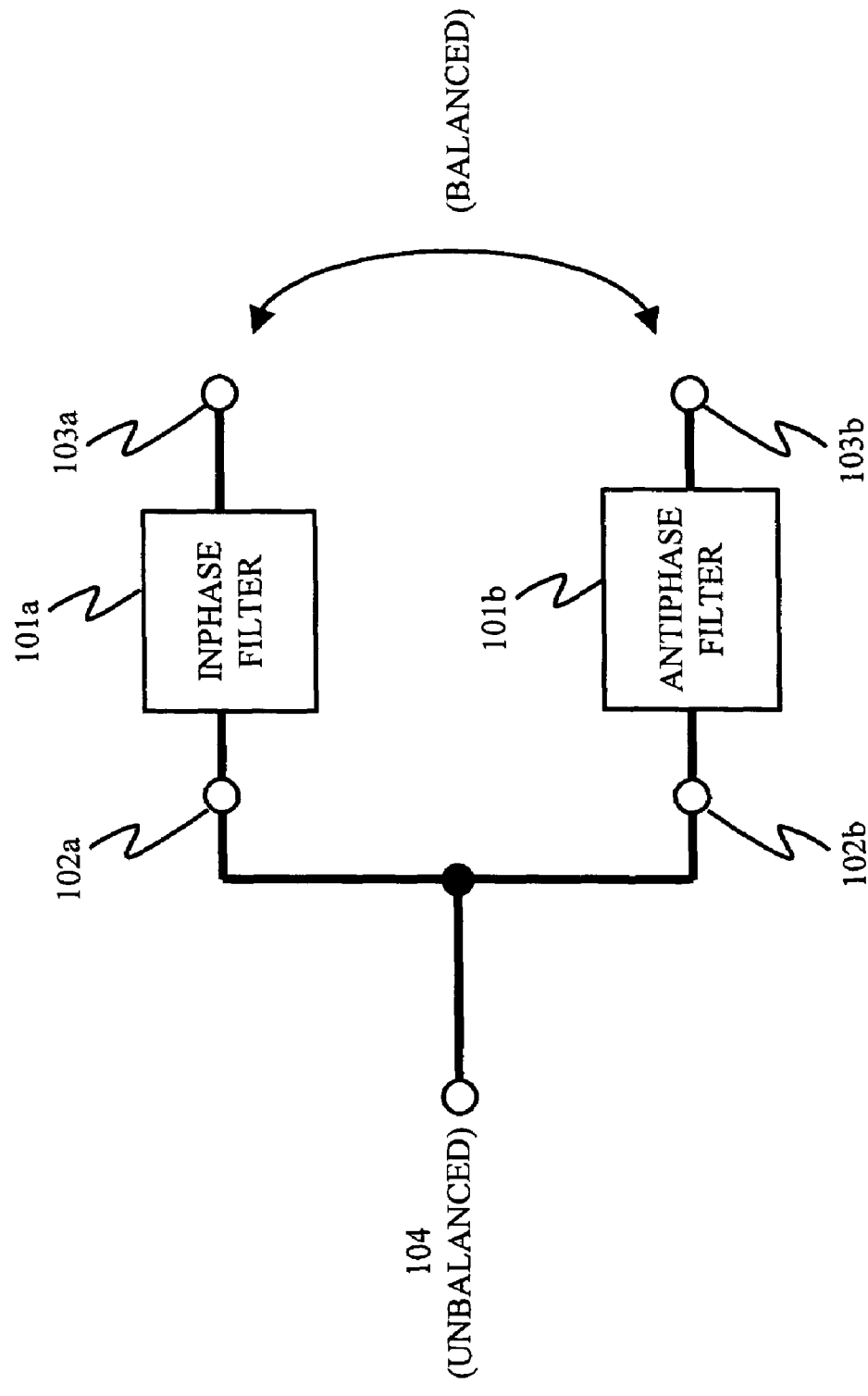
FIG. 1 is a schematic view of a representative structure of the parallel balance filter.
Figure 2:
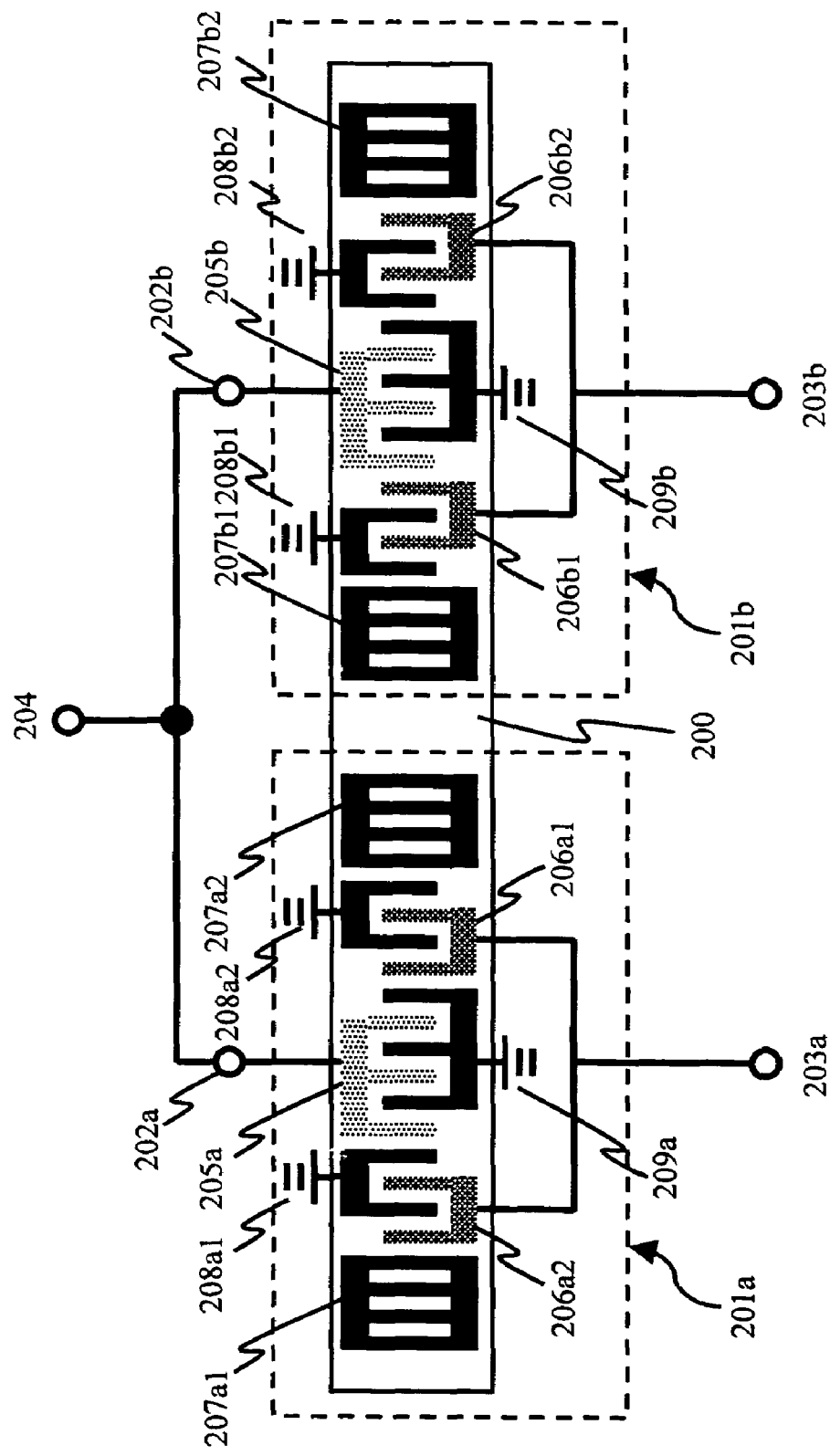
FIG. 2 shows an example of a structure of a parallel balanced filter having a SAW filter thereon.
Figure 3A:
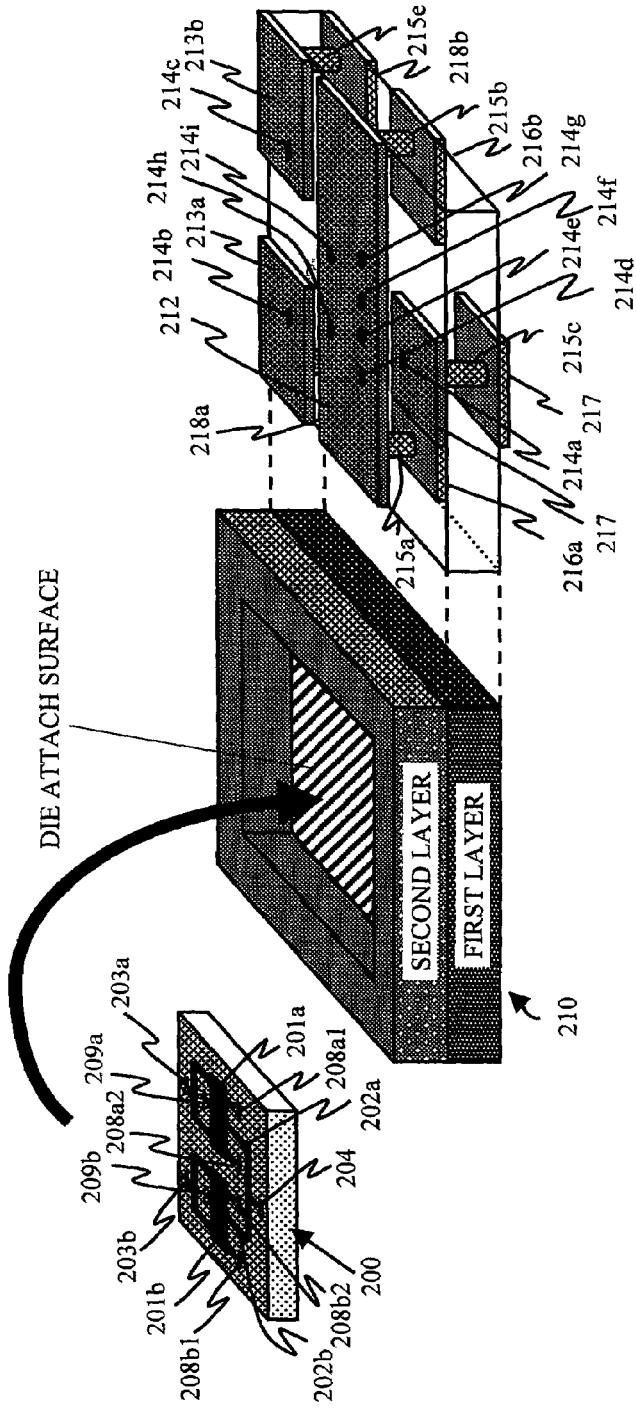
FIGS. 3A and 3B are views of a conventional balanced output SAW filter having the SAW filter chip facedown bonded to a package.
Figure 3B:
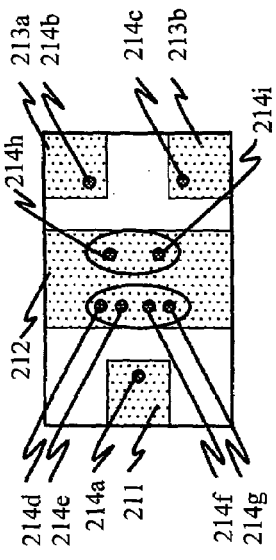

This balanced output filter includes an inphase filter (inphase DMS) 11a and an antiphase filter (antiphase DMS) 11b, each of which is a double-mode SAW filter having one input IDT and two output IDTs. Referring to FIG. 8A, the inphase DMS 11a and the antiphase DMS 11b are connected in parallel on a piezoelectric substrate 10. This SAW filter chip is facedown bonded to the die attach surface of the package same as shown in FIGS. 3A and 3B. The inphase DMS 11a includes an input terminal 12a, an input ground terminal 19a, output ground terminals 18a1 and 18a2, and a balanced output terminal 13b. The antiphase DMS 11b includes an input terminal 12b, an input ground terminal 19b, output ground terminals 18b1 and 18b2, and a balanced output terminal 13a. The input terminals 12a and 12b are connected to an external input terminal 14 provided for the piezoelectric substrate 10.

The die attach surface of the package (mounting surface of the SAW filter chip) has an input terminal 21, ground terminals 22a and 22b, a first balanced output terminal 23a, and a second balanced output terminal 23b. Au bumps (or solder balls) 21a through 24i are provided on the aforementioned terminals. The Au bump 24a provided on the input terminal 21 is connected to the input terminal 14 of the SAW filter chip. The Au bump 24b provided on the first balanced output terminal 23a is connected to the balanced output terminal 13a of the inphase DMS 11a of the SAW filter chip. The Au bump 24c provided on the second balanced output terminal 23b is connected to the balanced output terminal 13b of the antiphase DMS 11b of the SAW filter chip. The Au bumps 24d through 24g provided on the ground terminal 22a are connected to the output ground terminals 18a1, 18a2, 18b1, and 18b2 of the SAW filter chip. Two Au bumps 24h and 24i provided on the ground terminal 22b are connected to the input ground terminals 19a and 19b, and then are respectively connected to a first ground footpad 26a and a second ground footpad 26b through a first via 25a and a second via 25b. The first ground footpad 26a and the second ground footpad 26b are provided on a backside of the package. The input terminal 21, the first balanced output terminal 23a, and the second balanced output terminal 23b provided on the die attach surface are respectively connected to the corresponding footpads through a third via 25c, a fourth via 25d, and a fifth via 25e. The corresponding footpads are an input footpad 27, a first balanced output footpad 28a, and a second balanced output footpad 28b.

That is to say, according to the conventional balanced output filter, the input and output ground terminals (patterns) of the SAW filter chip are connected or unified on the die attach surface of the package, and are connected to the first ground footpad and the second ground footpad respectively provided on the backside of the package. In contrast, the balanced output filter of the present invention has two portions of the input and output ground metal patterns on the die attach surface. The input ground metal pattern is connected to the input ground terminal of the SAW filter chip, and the output ground metal pattern is connected to the output ground terminal of the SAW filter chip.

The structure of the present invention does not include the "common ground terminal" that is the connection point of the input ground and the output ground of the DMS filter. In other words, the common ground inductance Lg3 shown in the circuit model in FIGS. 5A and 5B is equal to zero. Thus, the balance characteristics are significantly improved as compared to the conventional balanced output filter.

Figure 9A:
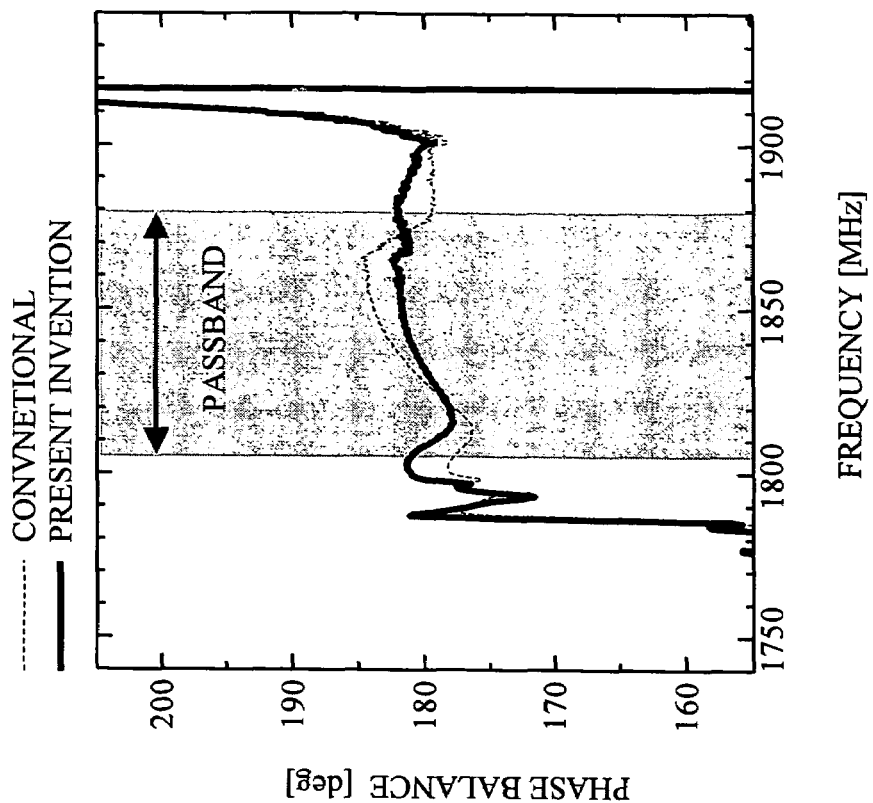
FIGS. 9A and 9B show comparisons of the balance characteristics between the balanced output SAW filter of the present invention and the conventional one.
Figure 9B:
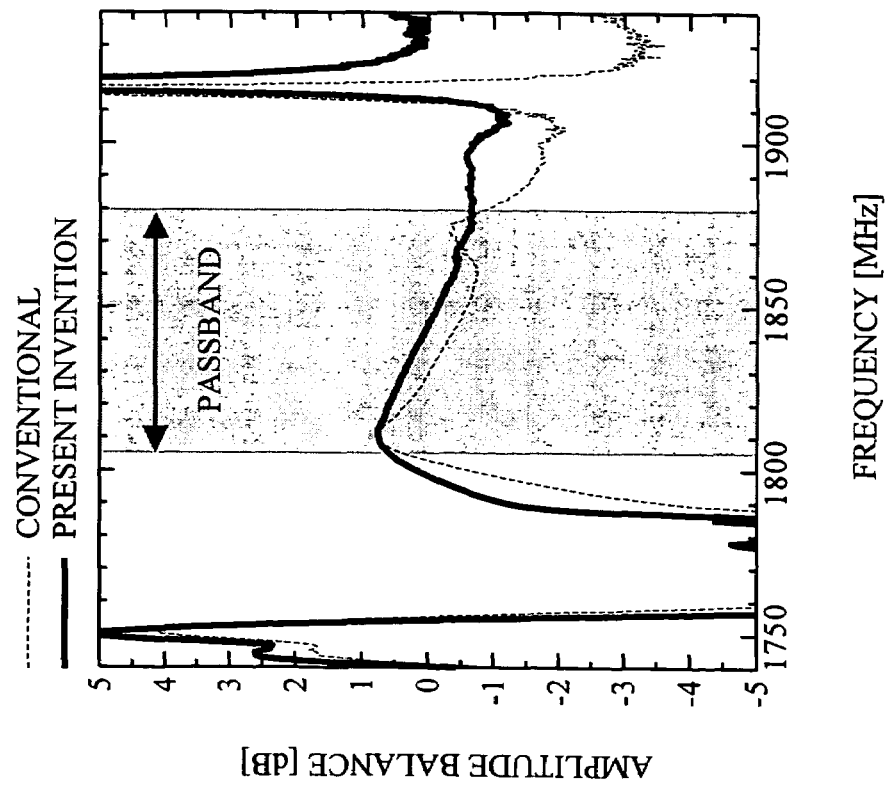

FIGS. 9A and 9B are graphs that comparatively show the balance characteristics between the balanced output SAW filter of the present invention and the conventional balanced output SAW filter. In FIGS. 9A and 9B, the vertical axis denotes frequency (MHz), and the horizontal axis in FIG. 9A denotes the amplitude balance by the dB. The horizontal axis in FIG. 9B denotes the phase balance by the degree. These figures show that the amplitude balance and the phase balance are drastically improved as compared to those of the conventional balanced output SAW filter. The balance characteristics are less excellent than those shown in FIGS. 7A and 7B in which the simulation result Lg3 is equal to 3 nH, because the coupling capacitance is not equal to zero.

(Second Embodiment)

Figure 10B:
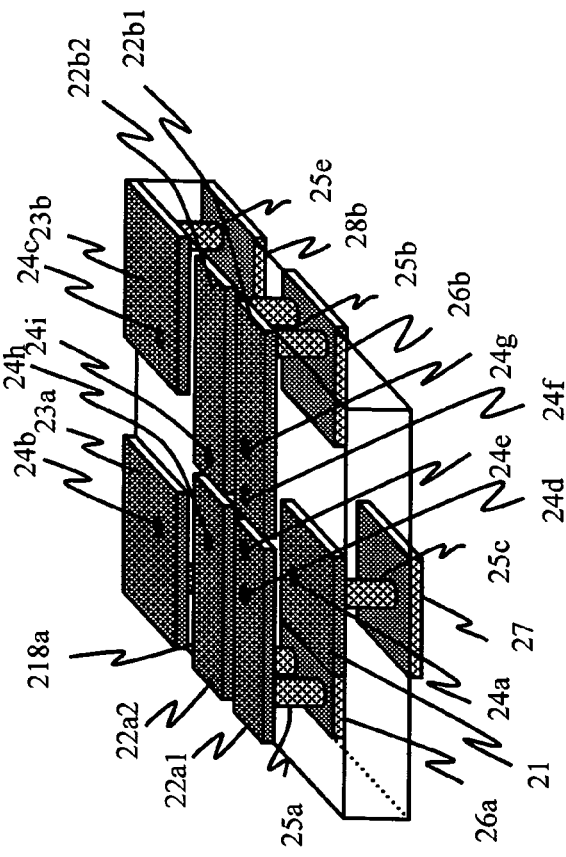
FIGS. 10A through 10D illustrate a configuration of a balanced output filter in accordance with a second embodiment of the present invention.
Figure 10D:
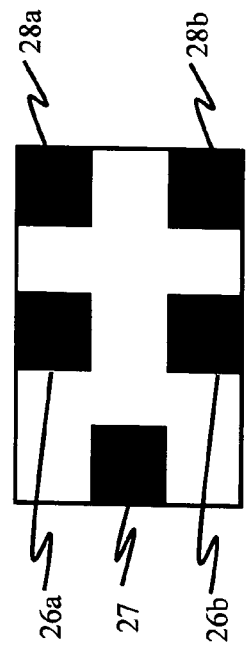
Figure 10A:
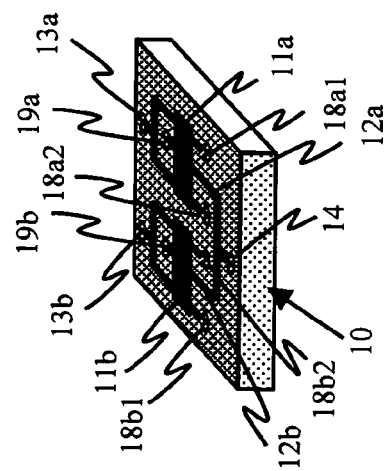
Figure 10C:
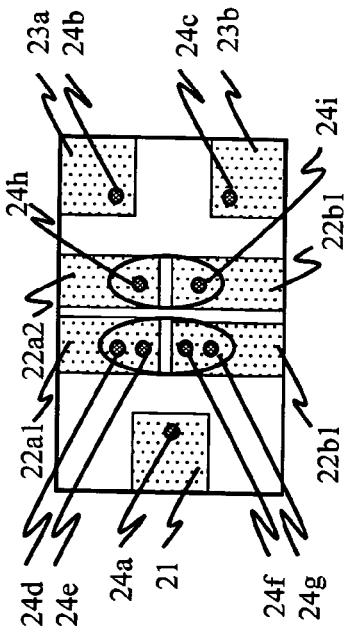

FIGS. 10A through 10D illustrate a configuration of a balanced output filter in accordance with a second embodiment of the present invention. FIG. 10A is a perspective view of a SAW filter chip. FIG. 10B shows a structure of the first layer of the package. The first layer has the same structure as that shown in FIGS. 3A and 3B. FIG. 10C is a top view of the die attach surface of the package. FIG. 10D shows a layout of the footpads arranged on the backside of the package (the first layer).

This balanced output filter also includes the inphase filter (inphase DMS) 11a and the antiphase filter (antiphase DMS) 11b, each of which is a double-mode SAW filter having one input IDT and two output IDTs. Referring to FIG. 10A, the inphase DMS 11a and the antiphase DMS 11b are connected in parallel on the piezoelectric substrate 10. This SAW filter chip is facedown bonded to the die attach surface of the package same as shown in FIGS. 3A and 3B. The inphase DMS 11a includes the input terminal 12a, the input ground terminal 19a, the output ground terminals 18a1 and 18a2, and the balanced output terminal 13a. The antiphase DMS 11b includes the input terminal 12b, the input ground terminal 19b, the output ground terminals 18b1 and 18b2, and the balanced output terminal 13b. The input terminals 12*a* and 12*b* are connected to the external input terminal 14 provided on the piezoelectric substrate 10.

The die attach surface of the package (mounting surface of the SAW filter chip) has the input terminal 21, the ground terminals 22*a*1, 22*a*2, 22*b*1, and 22*b*2, the first balanced output terminal 23*a*, and the second balanced output terminal 23*b*. The Au bumps (or solder balls) 21*a* through 24*i* are provided on the aforementioned terminals. The Au bump 24*a* provided on the input terminal 21 is connected to the input terminal 14 of the SAW filter chip. The Au bump 24*b* provided on the first balanced output terminal 23*a* is connected to the balanced output terminal 13*a* of the inphase DMS 11*a* of the SAW filter chip. The Au bump 24*c* provided on the second balanced output terminal 23*b* is connected to the balanced output terminal 13*b* of the antiphase DMS 11*b* of the SAW filter chip. The Au bumps 24*d* and 24*e* provided on the ground terminal 22*a*1 are connected to the output ground terminals 18*a*1 and 18*a*2 of the SAW filter chip. Two Au bumps 24*f* and 24*g* provided on the ground terminal 22*a*2 are connected to the output ground terminals 18*b*1 and 18*b*2. The Au bump 24*h* provided on the ground terminal 22*b*1 is connected to the input ground terminal 19*a*. The Au bump 24*i* provided on the ground terminal 22*b*2 is connected to the input ground terminal 19*b* of the SAW filter chip.

The ground terminals 22*a*1, 22*a*2, 22*b*1, and 22*b*2 are connected to the backside of the package through vias 25*a*1, 25*a*2, 25*b*1, and 25*b*2. The ground terminals 22*a*1 and 22*b*1 are connected to the first ground footpad 26*a*. The ground terminals 22*a*2 and 22*b*2 are connected to the second ground footpad 26*b*. The input terminal 21, the first balanced output terminal 23*a*, and the second balanced output terminal 23*b* provided on the die attach surface are respectively connected to the corresponding footpads (the input footpad 27, the first balanced output footpad 28*a*, and the second balanced output footpad 28*b*) through the vias 25*c*, 25*d*, and 25*e*.

The balanced output filter in accordance with the first embodiment of the present invention has two ground terminals on the die attach surface. The input ground metal pattern is connected to the input ground terminal of the SAW filter chip, and the output ground metal pattern is connected to the output ground metal patterns of the SAW filter chip. In accordance with the second embodiment of the present invention, the four ground metal patterns are provided. Those four ground metal patterns are respectively connected to the input ground terminal and the output ground terminal of the inphase DMS and the input ground terminal and the output ground terminal of the antiphase DMS. Then, the input ground terminal and the output ground terminal of the inphase DMS are connected to the first ground footpad 26*a*. The input ground terminal and the output ground terminal of the antiphase DMS are connected to the second ground footpad 26*b*. The first and second ground footpads also serve as the external ground terminals. The common ground inductance Lg3 of the inphase DMS and the antiphase DMS is equal to zero. Thus, the balance characteristics are significantly improved.

Figure 11A:
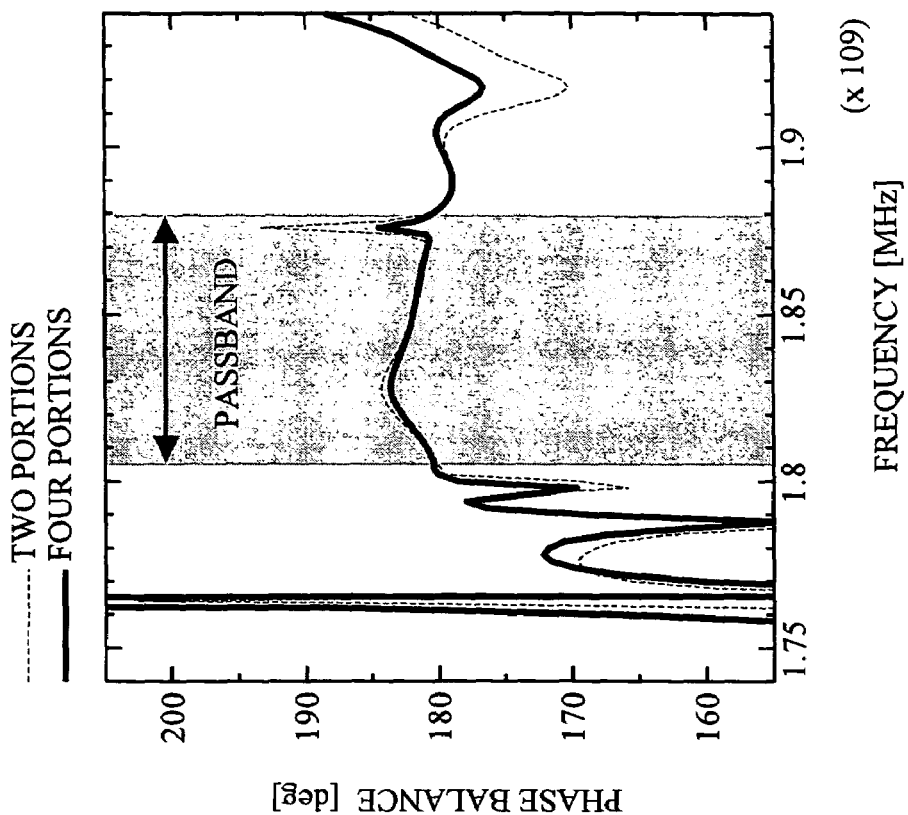
FIGS. 11A and 11B are graphs showing a comparison of the balance characteristics between the balanced output SAW filters of the first embodiment and the second embodiment of the present invention.
Figure 11B:
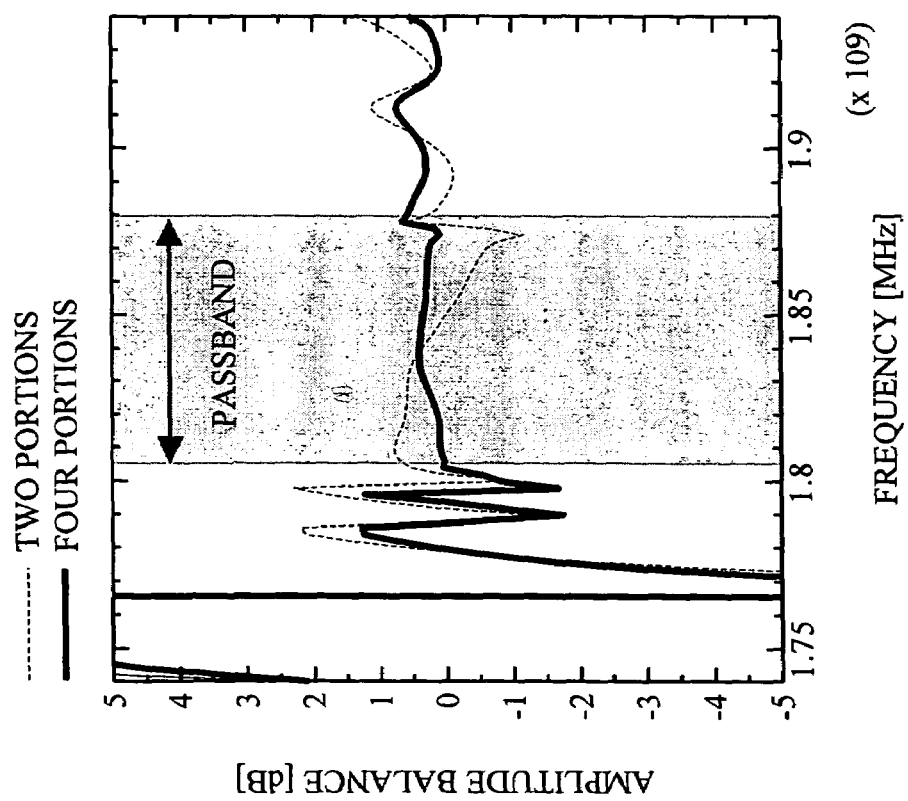

FIGS. 11A and 11B are graphs showing a comparison of the balance characteristics of the balanced output filters between the balanced output SAW filter of the first embodiment of the present invention and that of the second embodiment of the present invention. In FIGS. 11A and 11B, the vertical axis denotes frequency (MHz). The horizontal axis in FIG. 11A denotes the amplitude balance by the dB. The horizontal axis in FIG. 11B denotes the phase balance by the degree. The balanced output filter is configured so that the grounds of the inphase DMS and the antiphase DMS are separately provided in accordance with the embodiments of the present invention. Thus, the balance characteristics, particularly the amplitude balance characteristics, are significantly improved.

(Third Embodiment)

Figure 12B:
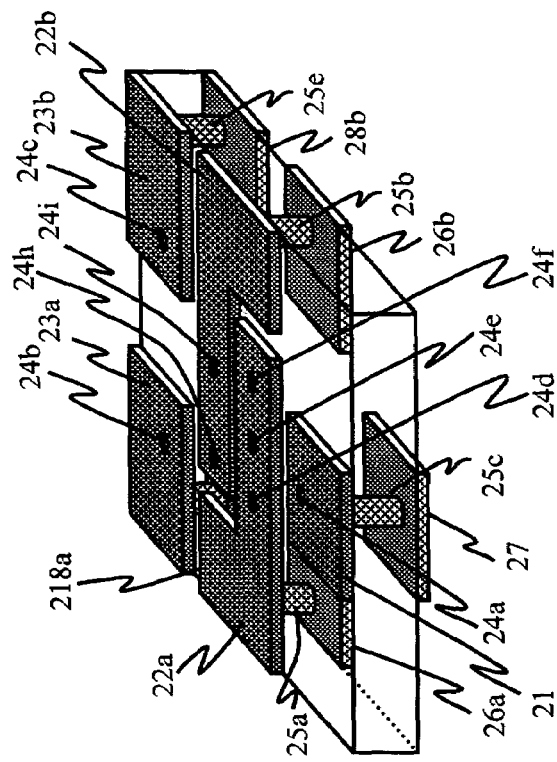
FIGS. 12A through 12D illustrate a configuration of a balanced output filter in accordance with a third embodiment of the present invention.
Figure 12D:
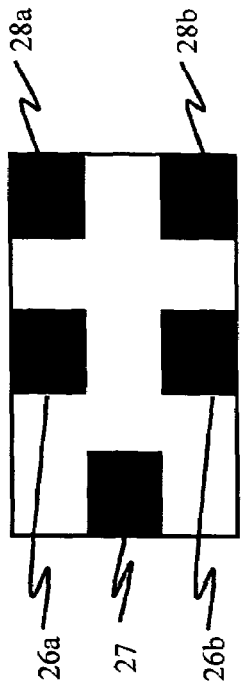
Figure 12A:
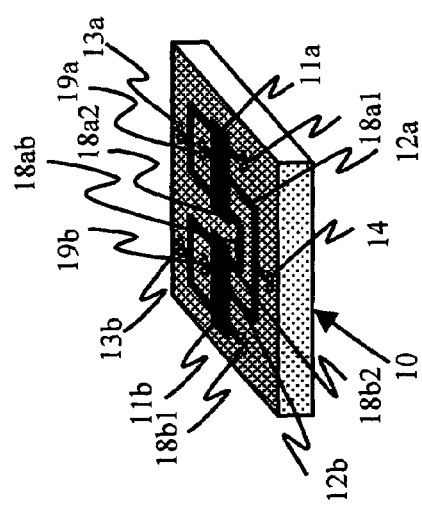
Figure 12C:
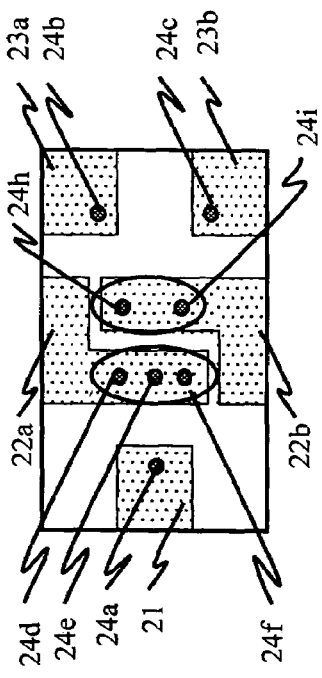

FIGS. 12A through 12D illustrate a configuration of a balanced output filter in accordance with a third embodiment of the present invention. FIG. 12A is a perspective view of a SAW filter chip. FIG. 12B shows a structure of the first layer of the package. The first layer has the same structure as that shown in FIGS. 3A and 3B. FIG. 12C is a top view of the die attach surface of the package. FIG. 12D shows a layout of the footpads arranged on the backside of the package (the first layer).

The balanced output filter in accordance with the third embodiment of the present invention is configured so that the output ground terminal 18*a*2 of the inphase DMS 11*a* is connected to the output ground terminal 18*b*2 of the antiphase DMS 11*b* on the SAW filter chip. The Au bump 18*ab* is put on this connection point. Also, three Au bumps are provided on the first ground terminal 22*a*. Except the aforementioned configuration, the balanced output filter in accordance with the third embodiment of the present invention is same as that of the first embodiment of the present invention, and a detailed explanation is omitted here.

With the aforementioned configuration, the number of the Au bumps required for bonding is thus reduced by 1, and the production cost can be suppressed. This configuration also makes it possible to maintain the common ground inductance Lg3 equal to zero, as in the first embodiment of the present invention. The balance characteristics can be improved significantly.

(Fourth Embodiment)

Figure 13A:
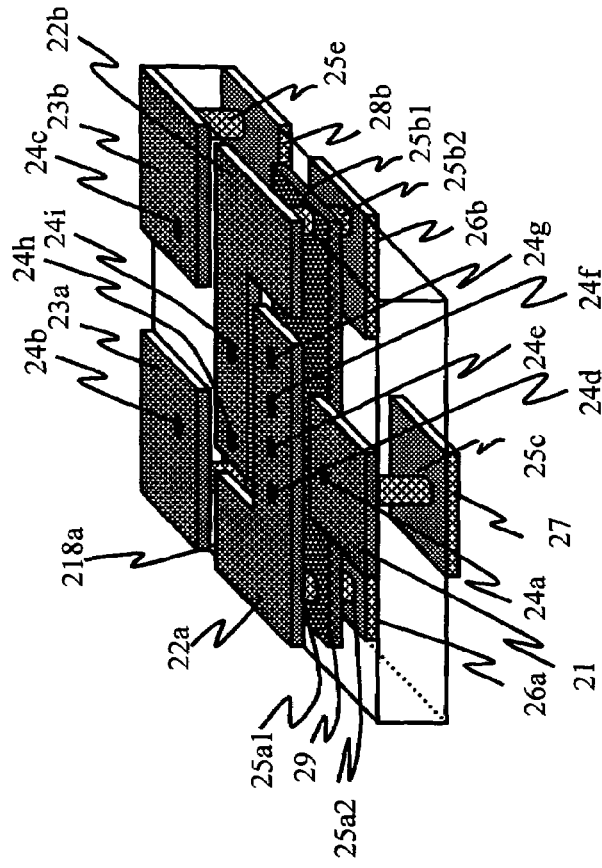
FIGS. 13A through 13D illustrate a configuration of a balanced output filter in accordance with a fourth embodiment of the present invention.
Figure 13B:
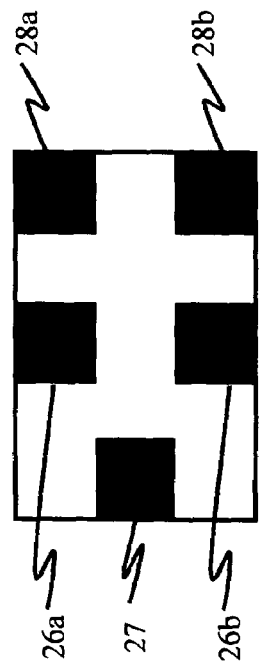
Figure 13C:
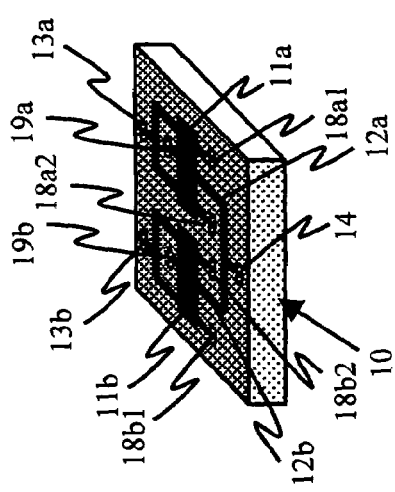
Figure 13D:
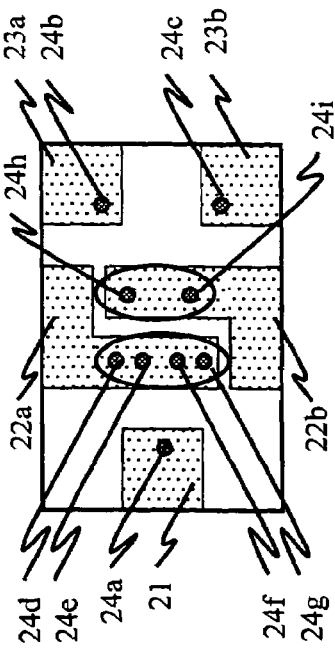

FIGS. 13A through 13D illustrate a configuration of a balanced output filter in accordance with a fourth embodiment of the present invention. FIG. 13A is a perspective view of a SAW filter chip. FIG. 13B shows a structure of the first layer of the package. The first layer has the same structure as that shown in FIGS. 8B and 8C. FIG. 13C is a top view of the die attach surface of the package. FIG. 13D shows a layout of the footpads arranged on the backside of the package (the first layer).

The balanced output filter in accordance with the fourth embodiment of the present invention is configured to further include a metal layer 29 arranged between the die attach surface and the footpad surface of the package. The metal layer 29 serves as the common ground terminal. Except the metal layer 29, the configuration in accordance with the fourth embodiment is the same as that of the first embodiment of the present invention. Thus, a detailed explanation is omitted here.

The first ground terminal 22*a* is connected to the common ground terminal (the metal layer 29) through the via 25*a*1 in the balanced output filter in accordance with the fourth embodiment of the present invention. The second ground terminal 22*b* is connected to the common ground terminal (the metal layer 29) through the via 25*b*1. The common ground terminal 29 is connected to the ground footpad 26*a* through the vias 25*a*2 and 25*b*2.

The inductance component of the vias 25*a*2 and 25*b*2 correspond to the common ground inductance Lg3 in the configuration shown in FIGS. 13A through 13D. The value of the inductance becomes smaller as the length of the via is shorter, as compared to the common ground inductance Lg3 of the conventional configuration as shown in FIGS. 3A and 3B. The common ground inductance Lg3 of the conventional configuration corresponds to the inductance component of the vias 215a and 215b. That is to say, the common ground inductance Lg3 is arranged between the common ground terminal (the metal layer 29) and the external ground terminals (the ground footpads 26a and 26b), and is smaller than that of the conventional configuration. Thus, the balance characteristics can be improved drastically as compared to the conventional balanced output filter.

(Fifth Embodiment)

Figure 14A:
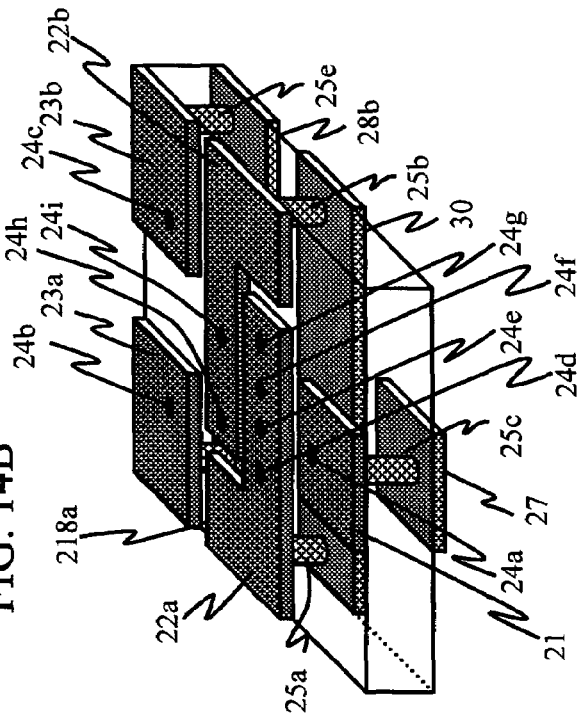
FIGS. 14A through 14D illustrate a configuration of a balanced output filter in accordance with a fifth embodiment of the present invention.
Figure 14C:
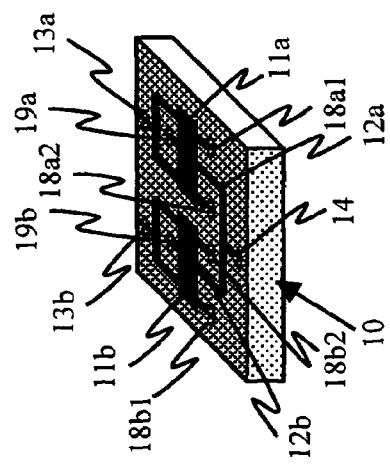
Figure 14B:
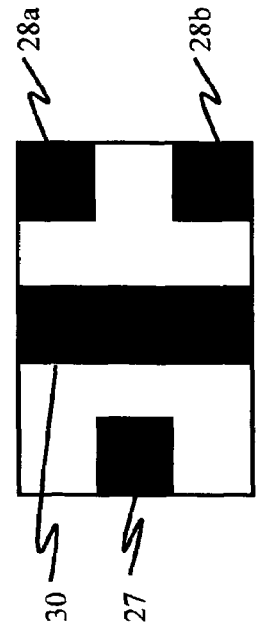
Figure 14D:
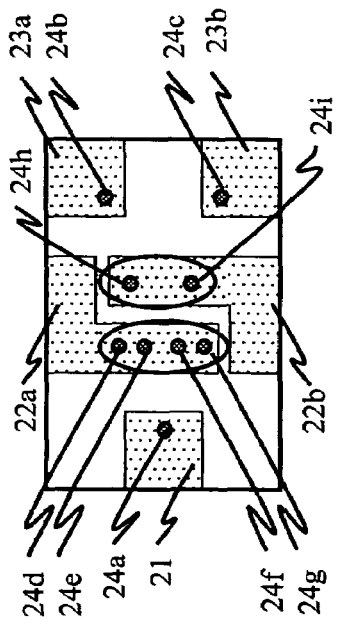

FIGS. 14A through 14D illustrate a configuration of a balanced output filter in accordance with a fifth embodiment of the present invention. FIG. 14A is a perspective view of a SAW filter chip. FIG. 14B shows a structure of the first layer of the package. The first layer has the same structure as that shown in FIGS. 8B and 8C. FIG. 14C is a top view of the die attach surface of the package. FIG. 14D shows a layout of the footpads arranged on the backside of the package (the first layer).

The balanced output filter in accordance with the fifth embodiment of the present invention is configured so that the first ground footpad 26a and the second ground footpad 26b serve as a single ground footpad 30. Except for this, the configuration is the same as that of the first embodiment of the present invention, and a detailed explanation is omitted here. With this configuration, the ground footpad 30 forms the connection point of the input ground terminal and the output ground terminal, namely, the common ground terminal. The ground footpad 30 serves as the external ground terminal. Therefore, the common ground inductance Lg3 of the circuit model shown in FIGS. 5A and 5B is equal to zero. The balance characteristics can be improved more than that of the conventional parallel balanced output filter.

(Sixth Embodiment)

FIGS. 15A through 15D illustrate a configuration of a balanced output filter in accordance with a sixth embodiment of the present invention. FIG. 15A is a perspective view of a SAW filter chip. FIG. 15B shows a structure of the first layer of the package. The first layer has the same structure as that shown in FIGS. 8B and 8C. FIG. 15C is a top view of the die attach surface of the package. FIG. 15D shows a layout of the footpads arranged on the backside of the package (the first layer).

The balanced output filter in accordance with the sixth embodiment of the present invention is configured so that a surface acoustic wave resonator (one-port SAW resonator) 31 is coupled to the input terminal 14 on the SAW filter chip of the balanced output filter in accordance with the first embodiment of the present invention. The one-port SAW resonator 31 is formed on the piezoelectric substrate 10. One terminal of the one-port SAW resonator 31 is connected to the input terminal 14 in series, and the other terminal is configured to serve as a new input terminal 14'. The new input terminal 14' is connected to an input terminal (not shown) of the package. Except for the aforementioned configuration, the balanced output filter in accordance with the sixth embodiment of the present invention is same as that of the first embodiment of the present invention, and a detailed explanation is omitted here.

With this configuration, the balanced output filter in accordance with the sixth embodiment of the present invention is capable of obtaining the effect of characteristics improvement same as in the first embodiment of the present invention. The filter characteristics having an improved suppression in the stopband are obtainable by connecting the one-port SAW resonator 31. The one-port SAW resonator 31 is not necessarily connected in series as shown in FIGS. 15A through 15D. The one-port SAW resonator 31 may be connected in parallel. Furthermore, multiple one-port SAW resonators 31 may be connected in either series or parallel.

(Seventh Embodiment)

The balanced output filter that has been described so far is obtained by mounting the SAW filter chip formed on the piezoelectric substrate on the package. The present invention is not limited to the aforementioned SAW filter. The present invention may be applied to other balanced output filters such as the FBAR filter, the BAR filter, and the dielectric filter.

Figure 16B:
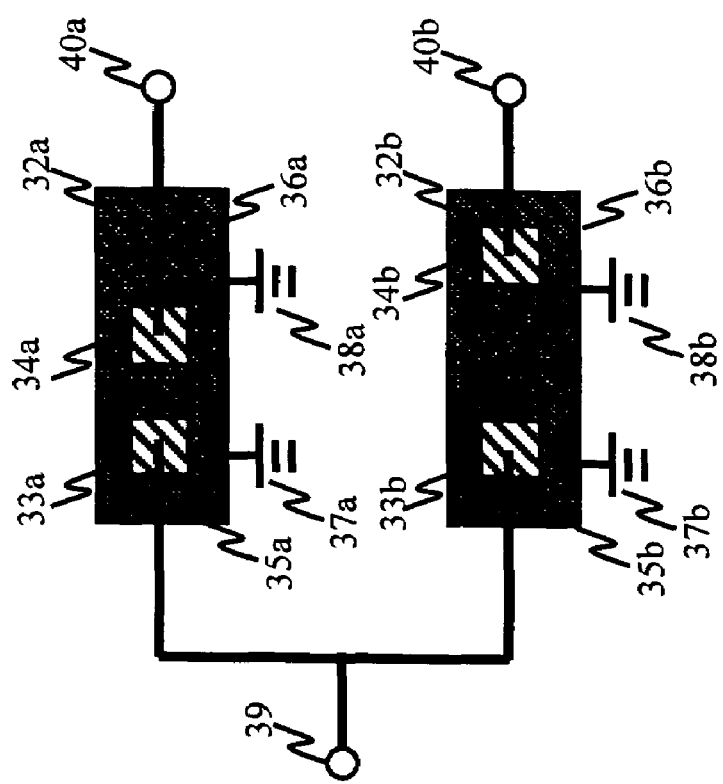
FIGS. 16A and 16B illustrate a configuration of a FBAR chip to be mounted on a balanced output filter in accordance with a seventh embodiment of the present invention.
Figure 16A:
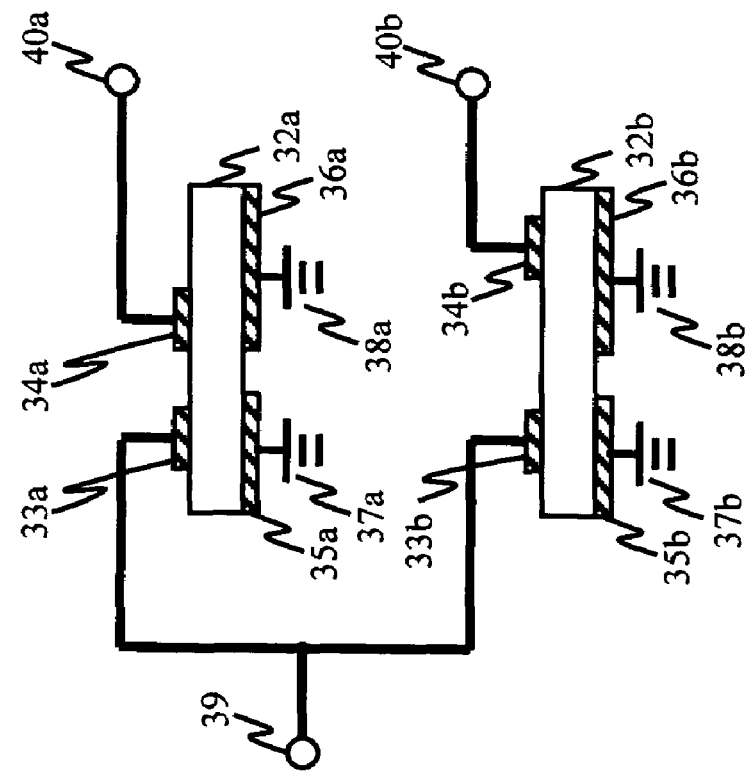

FIGS. 16A and 16B schematically show a configuration of an FBAR chip mounted on the balanced output filter of the present invention. FIG. 16A is a schematic cross-sectional view. FIG. 16B is a schematic top view. Two FBARs include piezoelectric films 32a and 32b, input electrodes 33a and 33b, output electrodes 34a and 34b, an input ground electrode 35a and 35b, output ground electrodes 36a and 36b, input ground terminals 37a and 37b, output ground terminals 38a and 38b, a first balanced output terminal 40a, and a second balanced output terminal 40b. The two FBARs are connected in parallel, and a signal is applied to an input terminal 39. One FBAR having suffixes of a (or b) configured to be an inphase FBAR, and the other FBAR having suffixes of b (or a) is configured to be an antiphase FBAR. The FBAR chip is facedown bonded to the package having the die attach surface, the die attach surface being same as those of the first through sixth embodiments of the present invention.

In other words, the input terminal 21, the ground terminals 22a and 22b, and the first and second balanced output terminals 23a and 23b are provided on the die attach surface (the mounting surface of the FBAR filter chip). The Au bumps (or solder balls) 24a through 24i are provided for the aforementioned terminals. The Au bump 24a provided on the input terminal 21 is connected to the input terminal 39 of the FBAR filter chip. The Au bump 24b provided on the first balanced output terminal 23a is connected to the balanced output terminal 40a or 40b of the inphase FBAR. The Au bump 24c provided on the second balanced output terminal 23b is connected to the balanced output terminal 40b or 40a of the antiphase FBAR of the FBAR filter chip. The Au bumps 24d through 24g provided on the ground terminal 22a are connected to the output ground terminals 38a and 38b of the FBAR filter chip. The Au bumps 24h and 24i are connected to the input ground terminals 37a and 37b of the FBAR filter chip.

The above-mentioned characteristics of the FBAR chip can be simulated with the circuit model shown in FIGS. 5A and 5B. The balance characteristics can be improved by reducing the common ground inductance Lg3 of the circuit model in accordance with the seventh embodiment of the present invention, as described in the first through the sixth embodiments.

(Eighth Embodiment)

The balanced output filter of the present invention may be applied to a duplexer. When the balanced output filter is used in the duplexer, a transmission filter may employ a ladder filter (unbalanced output) and a reception filter may employ the balanced output filter (balanced output). In addition, the transmission filter may employ the balanced output filter (balanced output) and the reception filter may employ the ladder filter (unbalanced output). Further, both of the transmission and the reception filters may employ the balanced output filters (balanced output).

The present invention provides the technique for significantly improving both of the amplitude balance and the phase balance of the balanced output filter.

The present invention is not limited to the above-mentioned embodiments, and other embodiments, variations and modifications may be made without departing from the scope of the present invention.

The present invention is based on Japanese Patent Application No. 2004-134388 filed on Apr. 28, 2004, the entire disclosure of which is hereby incorporated by reference.

What is claimed is:

1. A balanced output filter comprising:
   a package having an input ground metal pattern and an output ground metal pattern; and
   a filter chip having an inphase filter and an antiphase filter, which filters are mounted on the package,
   at least one of the inphase and antiphase filters having an input ground terminal connected to the input ground metal pattern and an output ground terminal connected to the output ground metal pattern,
   the input and output ground terminals of said at least one of the inphase and antiphase filters being separate from each other on the filter chip, wherein: the input ground metal pattern comprises a first portion and a second portion separate from the first portion; and
   the output ground metal pattern comprises a third portion and a fourth portion separate from the third portion,
   the first portion being coupled to the input ground terminal of the inphase filter, the second portion being coupled to the input ground terminal of the antiphase filter, the third portion being coupled to the output ground terminal of the inphase filter, the fourth portion being coupled to the output ground terminal of the antiphase filter.

2. The balanced output filter as claimed in claim 1, wherein the filter chip is facedown bonded to a die attach surface of the package on which surface the input and output ground metal patterns are provided.

3. The balanced output filter as claimed in claim 2, wherein the other one of the inphase and antiphase filters has input and output ground terminals respectively connected to the input and output ground metal patterns separate from each other on the die-attach surface of the filter chip.

4. The balanced output filter as claimed in claim 2, wherein the input and output ground metal patterns on the die attach surface of the package are isolated from each other within the package.

5. The balanced output filter as claimed in claim 1, wherein the inphase and antiphase filters have input ground terminals connected on the filter chip.

6. The balanced output filter as claimed in claim 1, wherein the inphase and antiphase filters have output ground terminals connected on the filter chip.

7. The balanced output filter as claimed in claim 1, wherein:
   the filter chip has a piezoelectric substrate on which the inphase and antiphase filters are formed; and
   each of the inphase and antiphase filters has input and output IDTs respectively connected to the input and output ground terminals.

8. The balanced output filter as claimed in claim 7, wherein at least one of the inphase and antiphase filters is a double-mode surface acoustic wave filter having one input IDT and two output IDTs.

9. The balanced output filter as claimed in claim 1, wherein the inphase and antiphase filters have input ground terminals separate from each other on the filter chip, and output ground terminals separate from each other on the filter chip.

10. The balanced output filter as claimed in claim 1, wherein the inphase and antiphase filters include respective surface acoustic wave resonators connected to respective input terminals.

11. The balanced output filter as claimed in claim 1, wherein at least two of the first, second, third, and fourth portions are connected in a portion of the package other than the die attach surface.

12. The balanced output filter as claimed in claim 1, wherein at least two of the first, second, third, and fourth portions are connected on a backside of the package.

13. A balanced output filter comprising:
   a package having an input ground metal pattern and an output ground metal pattern; and
   a filter chip having an inphase filter and an antiphase filter, which filters are mounted on the package.
   at least one of the inphase and antiphase filters having an input ground terminal connected to the input ground metal pattern and an output ground terminal connected to the output ground metal pattern,
   the input and output ground terminals of said at least one of the inphase and antiphase filters being separate from each other on the filter chip, wherein;
   the input ground metal pattern comprises first and second portions separate from each other, the first portion being coupled to the input ground terminal of the inphase filter, the second portion being coupled to the input ground terminal of the antiphase filter and
   the output ground metal pattern comprises third and fourth portions separate from each other, the third portion being coupled to the output ground terminal of the inphase filter, the fourth portion being coupled to the output ground terminal of the antiphase filter.

* * * * *